(12) United States Patent
McSorley et al.

(10) Patent No.: US 11,903,163 B2
(45) Date of Patent: Feb. 13, 2024

(54) METHODS AND DEVICES TO EMPLOY AIR COOLED COMPUTERS IN LIQUID IMMERSION COOLING

(71) Applicant: TMGCore, INC, Plano, TX (US)

(72) Inventors: Michael McSorley, Plano, TX (US); Randall Coburn, Plano, TX (US)

(73) Assignee: TMGCore, INC., Plano, TX (US)

(*) Notice: Subject to any disclaimer, the term of this patent is extended or adjusted under 35 U.S.C. 154(b) by 0 days.

(21) Appl. No.: 17/963,702

(22) Filed: Oct. 11, 2022

(65) Prior Publication Data

US 2023/0110186 A1 Apr. 13, 2023

Related U.S. Application Data

(60) Provisional application No. 63/254,224, filed on Oct. 11, 2021.

(51) Int. Cl.
*H05K 7/20* (2006.01)
*G06F 1/20* (2006.01)

(52) U.S. Cl.
CPC ........... *H05K 7/20209* (2013.01); *G06F 1/20* (2013.01); *H05K 7/203* (2013.01); *G06F 1/206* (2013.01)

(58) Field of Classification Search
CPC ...... H05K 7/20209; H05K 7/203; G06F 1/20; G06F 1/206
USPC ........................................................ 700/300
See application file for complete search history.

(56) References Cited

U.S. PATENT DOCUMENTS

| | | | |
|---|---|---|---|
| 6,428,282 B1 * | 8/2002 | Langley | F04D 27/004 417/42 |
| 6,641,521 B2 * | 11/2003 | Kolarovic | A61G 11/00 600/22 |
| 7,213,391 B2 | 5/2007 | Jones | |
| 7,885,070 B2 | 2/2011 | Campbell et al. | |
| 7,957,145 B2 | 6/2011 | Suzuki et al. | |
| 7,961,475 B2 | 6/2011 | Campbell et al. | |
| 8,009,419 B2 | 8/2011 | Attlesey et al. | |
| 8,014,150 B2 | 9/2011 | Campbell et al. | |
| 8,089,765 B2 | 1/2012 | Attlesey | |
| 8,194,406 B2 | 6/2012 | Campbell et al. | |
| 8,351,206 B2 | 1/2013 | Campbell et al. | |

(Continued)

FOREIGN PATENT DOCUMENTS

| | | |
|---|---|---|
| WO | 2019138176 A1 | 7/2019 |
| WO | 2020225649 A1 | 11/2020 |

(Continued)

OTHER PUBLICATIONS

International Search Report and Written Opinion dated Feb. 3, 2023 issued in PCT/US22/46276.

*Primary Examiner* — Chun Cao
(74) *Attorney, Agent, or Firm* — Hunton Andrews Kurth LLP

(57) ABSTRACT

The present disclosure refers to methods of employing a computer comprising a pulse width modulated controlled cooling fan in an immersion cooling process. The present disclosure also refers to devices therefore. Such methods and devices employ a direct conversion or a probabilistic approach to emulate the operation of a pulse width modulated controlled cooling fan. The aforementioned methods and devices may be particularly useful for fans having a fan speed of 25,000 rpm or higher.

4 Claims, 2 Drawing Sheets

(56) References Cited

U.S. PATENT DOCUMENTS

| | | |
|---|---|---|
| 8,490,418 B2 | 7/2013 | Weber et al. |
| 8,711,565 B2 | 4/2014 | Wagoner et al. |
| 8,867,209 B2 | 10/2014 | Campbell et al. |
| 8,941,994 B2 | 1/2015 | Campbell et al. |
| 8,947,873 B2 | 2/2015 | Campbell et al. |
| 8,953,317 B2 | 2/2015 | Campbell et al. |
| 8,953,320 B2 | 2/2015 | Campbell et al. |
| 8,964,391 B2 | 2/2015 | Campbell et al. |
| 8,966,922 B2 | 3/2015 | Campbell et al. |
| 8,976,526 B2 | 3/2015 | Kulkarni et al. |
| 9,049,800 B2 | 6/2015 | Shelnutt et al. |
| 9,095,942 B2 | 8/2015 | Campbell et al. |
| 9,101,078 B2 | 8/2015 | Campbell et al. |
| 9,144,179 B2 | 9/2015 | Shelnutt et al. |
| 9,153,374 B2 | 10/2015 | Kulkarni et al. |
| 9,178,400 B2 | 11/2015 | Pal et al. |
| 9,195,282 B2 | 11/2015 | Shelnutt et al. |
| 9,223,360 B2 | 12/2015 | Attlesey et al. |
| 9,261,308 B2 | 2/2016 | Campbell et al. |
| 9,282,678 B2 | 3/2016 | Campbell et al. |
| 9,313,920 B2 | 4/2016 | Campbell et al. |
| 9,328,964 B2 | 5/2016 | Shelnutt et al. |
| 9,332,674 B2 | 5/2016 | Campbell et al. |
| 9,351,429 B2 | 5/2016 | Shelnutt et al. |
| 9,357,675 B2 | 5/2016 | Campbell et al. |
| 9,414,520 B2 | 8/2016 | Campbell et al. |
| 9,433,132 B2 | 8/2016 | Krishnan et al. |
| 9,516,792 B2 | 12/2016 | Krishnan et al. |
| 9,543,787 B2 | 1/2017 | Duchesneau |
| 9,596,787 B1 | 3/2017 | Google |
| 9,622,379 B1 | 4/2017 | Campbell et al. |
| 9,655,279 B2 | 5/2017 | Pelletier et al. |
| 9,713,290 B2 | 7/2017 | James et al. |
| 9,773,526 B2 | 9/2017 | Shelnutt et al. |
| 9,904,811 B2 | 2/2018 | Campbell et al. |
| 9,912,021 B2 | 3/2018 | Andres |
| 9,913,402 B2 | 3/2018 | Shafer et al. |
| 9,918,408 B2 | 3/2018 | Regimbal et al. |
| 9,921,622 B2 | 3/2018 | Shelnutt et al. |
| 9,974,212 B2 | 5/2018 | Ichinose et al. |
| 9,992,914 B2 | 6/2018 | Best et al. |
| 10,015,905 B2 | 7/2018 | Watanabe et al. |
| 10,018,425 B2 | 7/2018 | Shelnutt et al. |
| 10,020,242 B2 | 7/2018 | Katsumata et al. |
| 10,028,409 B1 | 7/2018 | Metzler et al. |
| 10,070,558 B2 | 9/2018 | Campbell et al. |
| 10,098,260 B2 | 10/2018 | Bouras et al. |
| 10,104,814 B2 | 10/2018 | Wagoner et al. |
| 10,130,008 B2 | 11/2018 | Shepard et al. |
| 10,149,408 B2 | 12/2018 | Fujiwara et al. |
| 10,206,307 B2 | 2/2019 | Lau |
| 10,206,308 B2 | 2/2019 | Meijer et al. |
| 10,257,960 B1 | 4/2019 | Banerjee et al. |
| 10,321,603 B1 | 6/2019 | Banerjee et al. |
| 10,485,137 B2 | 11/2019 | Helsel et al. |
| 10,512,192 B2 | 12/2019 | Miyoshi |
| 10,568,236 B2 | 2/2020 | Tian et al. |
| 10,609,839 B1 | 3/2020 | Archer et al. |
| 10,765,033 B1 | 9/2020 | Keehn et al. |
| 10,966,349 B1 | 3/2021 | Lau |
| 11,076,508 B2 | 7/2021 | Gao |
| 11,116,113 B2 | 9/2021 | Chiu et al. |
| 2005/0013114 A1* | 1/2005 | Ha ................ H05K 7/20209 361/679.48 |
| 2006/0013571 A1* | 1/2006 | Squibb ........... H05K 7/20209 388/804 |
| 2007/0019934 A1* | 1/2007 | Ku ..................... H02P 7/29 388/811 |
| 2010/0054964 A1 | 3/2010 | Teng et al. |
| 2012/0224322 A1 | 9/2012 | Artman et al. |
| 2019/0159359 A1 | 5/2019 | Tung et al. |
| 2019/0267683 A1 | 8/2019 | Shepard et al. |
| 2019/0357378 A1 | 11/2019 | Kolar et al. |
| 2020/0113083 A1 | 4/2020 | Schon et al. |
| 2020/0178414 A1 | 6/2020 | Bulinski et al. |
| 2020/0386488 A1 | 12/2020 | Smith et al. |
| 2021/0018356 A1 | 1/2021 | Bean, Jr. et al. |
| 2021/0059079 A1 | 2/2021 | Keehn et al. |
| 2021/0072273 A1* | 3/2021 | Chien ................. F04D 27/001 |
| 2021/0084790 A1 | 3/2021 | Sachdev et al. |
| 2021/0180874 A1 | 6/2021 | Eadelson |

FOREIGN PATENT DOCUMENTS

| | | |
|---|---|---|
| WO | 2021111296 A1 | 6/2021 |
| WO | 2019155179 A1 | 8/2022 |

* cited by examiner

METHODS AND DEVICES TO EMPLOY AIR COOLED COMPUTERS IN LIQUID IMMERSION COOLING

CROSS-REFERENCE TO RELATED APPLICATIONS

This application claims priority to U.S. Provisional Application 63/254,224 filed on Oct. 11, 2021 which is herein incorporated by reference in its entirety. This application is related to PCT publication WO2020/102090 filed Nov. 11, 2019 titled "Liquid Immersion Cooling Platform" owned by TMGCore, LLC which application is incorporated herein by reference.

FIELD OF THE DISCLOSURE

The present disclosure relates to an electronic device for to emulate a pulse width modulation controlled fan for use in liquid immersion cooling system.

BACKGROUND AND SUMMARY

Traditional computing and/or server systems utilize air to cool the various components. Therefore, they typically have a Power-On Self Test (POST) which as part of the test will check for valid feedback from the fan to ensure the computer or server can be cooled by the fan. If the fan does not provide the feedback needed, then the computer or server will fail the Power-On Self Test and will not operate.

Traditional liquid or water cooled computers utilize a flowing liquid to draw heat from computer components but avoid direct contact between the computer components and the liquid itself. The development of electrically non-conductive and/or dielectric fluid enables the use of immersion cooling in which computer components and other electronics may be submerged in a dielectric or electrically non-conductive liquid in order to draw heat directly from the component into the liquid. Immersion cooling can be used to reduce the total energy needed to cool computer components and may also reduce the amount of space and equipment necessary for adequate cooling.

Liquid immersion cooling systems are being implemented for various computing needs. Unfortunately, many computers have fans designed for air cooling that do not function in an immersion cooled environment. As described above, if the fan does not function and send a signal to the computer that it is functioning, then many computers will not pass the POST and are therefore not usable in an immersion cooled environment.

What is needed is a solution so that computers designed to be air cooled can be cooled by immersion cooling. It would further be desirable if such a solution was not particularly costly, was applicable to many if not all air cooled computers, and/or was relatively easy to implement such that complex re-building of computer hardware or re-programming of computer software was not necessary. It would additionally or alternatively be advantageous if the solution did not involve destroying or altering the fan blades, fan components, and/or other computer components.

Advantageously, the instant application pertains to new methods which allows computers that are designed to be air cooled with a fan to be cooled by immersion cooling. The methods are not particularly costly, is applicable to many if not all air cooled computers, and/or is relatively easy to implement with destroying or altering fan components. In one embodiment the method comprises employing a computer comprising a pulse width modulated controlled cooling fan in an immersion cooling process. The method comprises converting a pulse width modulated controlled fan signal to one or more analog signals. The one or more analog control signals are fed to a voltage controlled oscillator which is configured to transmit one or more signals to the processor at a frequency to confirm to the processor that the pulse width modulated controlled cooling fan is operable.

In another embodiment the application pertains to a method of employing a computer comprising a pulse width modulated controlled cooling fan with a motor in an immersion cooling process. The method comprises employing a timing element to output a signal at a maximum frequency of the motor. The signal is mixed with an input to a pulse width modulated controller of the cooling fan and an AND gate in a manner approximates a reduction in frequency to confirm to the processor that the pulse width modulated controlled cooling fan is operable.

These and other objects, features and advantages of the exemplary embodiments of the present disclosure will become apparent upon reading the following detailed description of the exemplary embodiments of the present disclosure, when taken in conjunction with the appended claims.

BRIEF DESCRIPTION OF THE DRAWINGS

Various embodiments of the present disclosure, together with further objects and advantages, may best be understood by reference to the following description taken in conjunction with the accompanying drawings.

DETAILED DESCRIPTION

The following description of embodiments provides a non-limiting representative examples referencing numerals to particularly describe features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

Direct Conversion

Figure 1:
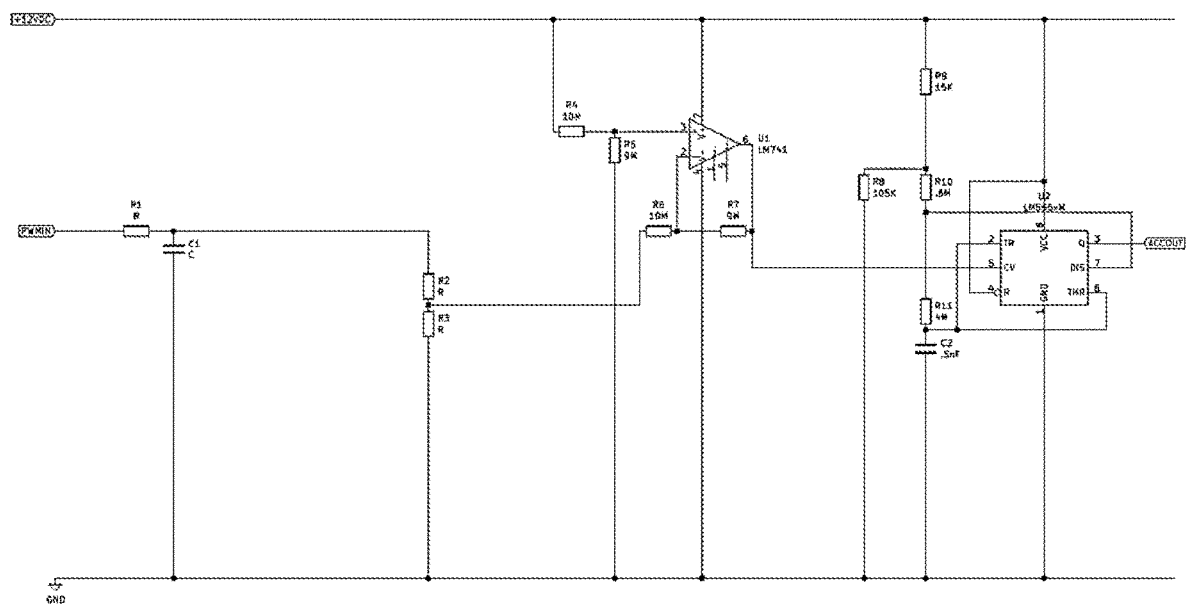
FIG. 1 shows an apparatus configured to be operable with a fan wherein the apparatus converts a pulse width modulated controlled fan signal to an analog signal which is then fed to a voltage controlled oscillator in a manner such that a computer that is designed to be air cooled with a fan may, if desired, be cooled by immersion cooling.

FIG. 1 shows an embodiment using a direct conversion approach. Such methods may be useful to employ a computer comprising a pulse width modulated controlled cooling fan in an immersion cooling process. The method steps and devices employed may vary depending upon the type of computer and related components and the specifics of the immersion cooling process to be employed. Generally, the method may comprise converting a pulse width modulated controlled fan signal to one or more analog signals. These signals may be further processed or fed directly to, for example, a voltage controlled oscillator. The type and specifications of the voltage controlled oscillator may vary depending upon the computer and immersion cooling to be employed. Typically, the voltage controlled oscillator is configured to transmit one or more signals to the processor at a frequency that confirms to the processor that the pulse width modulated controlled cooling fan is operable. In this manner the fan is emulated and the computer is operable in an immersion cooling process.

Probabilistic Approach

Figure 2:
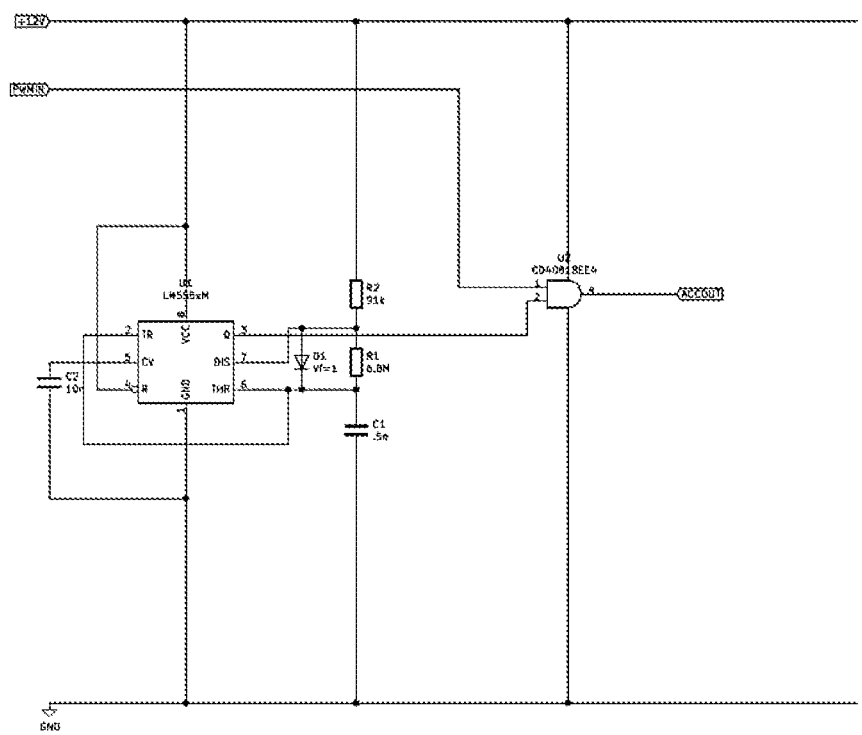
FIG. 2 shows an apparatus configured to be operable with a fan motor wherein the apparatus uses a probabilistic approach and employs a timing element to output a signal at a maximum frequency of the motor. The signal may be mixed with an input to a pulse width modulated controller of the cooling fan and an AND gate.

FIG. 2 shows an embodiment using a probabilistic approach to employ a computer comprising a pulse width modulated controlled cooling fan with a motor in an immersion cooling process. A representative method may comprise employing a timing element to output a signal at a maximum frequency of the motor. The signal may be mixed with an input to a pulse width modulated controller of the cooling fan and an AND gate. It is operated in a manner that approximates a reduction in frequency to confirm to the processor that the pulse width modulated controlled cooling fan is operable. That is, because pulse width modulating is only on for a percentage of duty cycle, only that percentage of the pulses reach the ACCOUT signal thereby approximating a reduction in frequency.

Suitable AND gates may implement a logical conjunction according to the truth table below.

| Input | | Output |
|---|---|---|
| A | B | A AND B |
| 0 | 0 | 0 |
| 0 | 1 | 0 |
| 1 | 0 | 0 |
| 1 | 1 | 1 |

In some embodiments a HIGH output (1) results only if all the inputs to the AND gate are HIGH (1). If none or not all inputs to the AND gate are HIGH, LOW output results. Of course, other combinations of signals may be employed so long as they approximates a reduction in frequency to confirm to the processor that the pulse width modulated controlled cooling fan is operable.

In the preceding specification, various embodiments have been described with references to the accompanying drawings. It will, however, be evident that various modifications and changes may be made thereto, and additional embodiments may be implemented, without departing from the broader scope of the invention as set forth in the claims that follow. The specification and drawings are accordingly to be regarded as an illustrative rather than restrictive sense.

We claim:

1. A method of employing a computer comprising a pulse width modulated controlled cooling fan in an immersion cooling process, wherein the method comprises:
    converting a pulse width modulated controlled fan signal to one or more analog signals;
    feeding said one or more analog control signals to a voltage controlled oscillator which is configured to transmit one or more signals to a processor at a frequency that confirms to the processor that the pulse width modulated controlled cooling fan is operable.

2. A method of employing a computer comprising a pulse width modulated controlled cooling fan with a motor in an immersion cooling process, wherein the method comprises:
    employing a timing element to output a signal at a maximum frequency of the motor;
    mixing the signal with an input to a pulse width modulated controller of the cooling fan and an AND gate in a manner that approximates a reduction in frequency to confirm to a processor that the pulse width modulated controlled cooling fan is operable.

3. The method of claim 1 wherein the pulse width modulated controlled cooling fan has a fan speed of 25,000 rpm or higher.

4. The method of claim 2 wherein the pulse width modulated controlled cooling fan has a fan speed of 25,000 rpm or higher.

* * * * *